(12) United States Patent
Cai et al.

(10) Patent No.: US 9,941,388 B2
(45) Date of Patent: Apr. 10, 2018

(54) METHOD AND STRUCTURE FOR PROTECTING GATES DURING EPITAXIAL GROWTH

(71) Applicant: GLOBALFOUNDRIES Inc., Grand Cayman (KY)

(72) Inventors: Xiuyu Cai, Niskayuna, NY (US); Ying Hao Hsieh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 390 days.

(21) Appl. No.: 14/309,096

(22) Filed: Jun. 19, 2014

(65) Prior Publication Data

US 2015/0372108 A1  Dec. 24, 2015

(51) Int. Cl.
| | |
|---|---|
| *H01L 21/336* | (2006.01) |
| *H01L 29/66* | (2006.01) |
| *H01L 29/78* | (2006.01) |
| *H01L 27/092* | (2006.01) |
| *H01L 21/8238* | (2006.01) |
| *H01L 29/165* | (2006.01) |

(52) U.S. Cl.
CPC .. *H01L 29/6656* (2013.01); *H01L 21/823814* (2013.01); *H01L 21/823864* (2013.01); *H01L 27/092* (2013.01); *H01L 29/6653* (2013.01); *H01L 29/66636* (2013.01); *H01L 29/7848* (2013.01); *H01L 29/165* (2013.01)

(58) Field of Classification Search
CPC ..... H01L 21/823418; H01L 21/823468; H01L 21/823814; H01L 21/823864; H01L 29/6653; H01L 29/6656; H01L 29/66636

USPC .......................................................... 438/300
See application file for complete search history.

(56) References Cited

U.S. PATENT DOCUMENTS

| | | | | | |
|---|---|---|---|---|---|
| 5,015,598 | A | * | 5/1991 | Verhaar | H01L 21/28247 216/39 |
| 5,710,450 | A | * | 1/1998 | Chau | H01L 21/2254 257/19 |
| 5,998,248 | A | * | 12/1999 | Ma | H01L 21/2257 257/E21.151 |
| 5,998,273 | A | * | 12/1999 | Ma | H01L 21/2257 257/E21.151 |
| 6,251,802 | B1 | * | 6/2001 | Moore | H01L 21/3146 257/E21.008 |
| 6,287,924 | B1 | * | 9/2001 | Chao | H01L 21/28052 257/E21.199 |
| 6,462,371 | B1 | * | 10/2002 | Weimer | H01L 21/02126 257/306 |

(Continued)

FOREIGN PATENT DOCUMENTS

WO        2006060528 A2    6/2006

*Primary Examiner* — Mary Wilczewski
(74) *Attorney, Agent, or Firm* — Williams Morgan, P.C.

(57) ABSTRACT

Embodiments of the present invention provide methods and structures for protecting gates during epitaxial growth. An inner spacer of a first material is deposited adjacent a transistor gate. An outer spacer of a different material is deposited adjacent the inner spacer. Stressor cavities are formed adjacent the transistor gate. The inner spacer is recessed, forming a divot. The divot is filled with a material to protect the transistor gate. The stressor cavities are then filled. As the gate is safely protected, unwanted epitaxial growth ("mouse ears") on the transistor gate is prevented.

14 Claims, 9 Drawing Sheets

(56) References Cited

U.S. PATENT DOCUMENTS

| | | | |
|---|---|---|---|
| 6,974,752 B2* | 12/2005 | Jang | H01L 21/28247 257/288 |
| 7,033,895 B2* | 4/2006 | Lee | H01L 29/42376 257/E21.409 |
| 7,064,071 B2* | 6/2006 | Schwan | H01L 21/823864 257/E21.64 |
| 7,064,085 B2* | 6/2006 | Chiu | H01L 29/6653 257/E21.53 |
| 7,176,110 B2* | 2/2007 | van Bentum | H01L 21/823418 257/E21.43 |
| 7,176,522 B2* | 2/2007 | Cheng | H01L 21/823807 257/204 |
| 7,279,386 B2 | 10/2007 | Kelling et al. | |
| 7,354,838 B2* | 4/2008 | Kammler | H01L 21/823807 257/E21.438 |
| 7,381,623 B1* | 6/2008 | Chen | H01L 21/823412 257/E21.43 |
| 7,618,856 B2* | 11/2009 | Ting | H01L 21/823807 257/E21.634 |
| 7,732,288 B2* | 6/2010 | Zhu | H01L 21/26506 257/347 |
| 7,745,296 B2* | 6/2010 | van Meer | H01L 29/41783 438/299 |
| 7,932,143 B1 | 4/2011 | Pal et al. | |
| 7,989,296 B2* | 8/2011 | Lee | H01L 29/66772 257/E21.43 |
| 8,003,470 B2* | 8/2011 | Tews | H01L 29/6653 257/E21.431 |
| 8,106,467 B2* | 1/2012 | Shima | H01L 21/823807 257/336 |
| 8,183,115 B2* | 5/2012 | Ishigaki | H01L 21/823418 257/368 |
| 8,574,970 B2* | 11/2013 | Cheng | H01L 29/66628 257/E21.619 |
| 8,642,415 B2* | 2/2014 | Adam | H01L 27/1203 438/163 |
| 8,644,068 B1* | 2/2014 | Yang | G11C 11/5628 365/185.01 |
| 8,647,954 B2* | 2/2014 | Alptekin | H01L 21/28518 438/300 |
| 8,652,914 B2* | 2/2014 | Alptekin | H01L 21/28518 438/300 |
| 8,697,528 B2* | 4/2014 | Dyer | H01L 21/30608 438/300 |
| 8,765,559 B2* | 7/2014 | Kronholz | H01L 21/823814 257/E21.626 |
| 8,829,576 B2* | 9/2014 | Zhu | H01L 29/66636 257/288 |
| 8,835,995 B2* | 9/2014 | Kang | H01L 21/0245 257/288 |
| 8,847,315 B2* | 9/2014 | Yang | H01L 27/1211 257/347 |
| 9,252,235 B2* | 2/2016 | Roh | H01L 21/823412 |
| 2003/0045061 A1* | 3/2003 | Kwon | H01L 29/6653 438/303 |
| 2004/0004424 A1* | 1/2004 | Sakurai | G02B 6/0085 313/110 |
| 2004/0132258 A1* | 7/2004 | Jin | H01L 29/6653 438/302 |
| 2005/0093075 A1* | 5/2005 | Bentum | H01L 29/66545 257/368 |
| 2005/0236694 A1* | 10/2005 | Wu | H01L 21/02126 257/632 |
| 2005/0279997 A1* | 12/2005 | Shin | H01L 21/02378 257/49 |
| 2006/0003533 A1* | 1/2006 | Kammler | H01L 21/26506 438/300 |
| 2008/0157091 A1* | 7/2008 | Shin | H01L 29/6656 257/66 |
| 2008/0224212 A1* | 9/2008 | Lee | H01L 29/6653 257/344 |
| 2009/0152634 A1* | 6/2009 | Grant | H01L 21/28114 257/368 |
| 2010/0320503 A1* | 12/2010 | Chong | H01L 29/66628 257/190 |
| 2011/0151674 A1* | 6/2011 | Tang | H01J 37/32357 438/715 |
| 2012/0213940 A1* | 8/2012 | Mallick | C23C 16/345 427/535 |
| 2012/0223364 A1* | 9/2012 | Chung | H01L 21/823807 257/192 |
| 2013/0032887 A1* | 2/2013 | He | H01L 21/823807 257/369 |
| 2013/0052779 A1* | 2/2013 | Flachowsky | H01L 21/823814 438/229 |
| 2013/0320550 A1* | 12/2013 | Kim | H01L 21/76897 257/773 |
| 2014/0087535 A1* | 3/2014 | Roh | H01L 21/823412 438/285 |
| 2014/0183663 A1* | 7/2014 | Song | H01L 21/265 257/408 |
| 2015/0035074 A1* | 2/2015 | Obradovic | H01L 29/785 257/369 |
| 2015/0126012 A1* | 5/2015 | Jeong | H01L 29/66628 438/300 |
| 2015/0372108 A1* | 12/2015 | Cai | H01L 29/6656 257/401 |
| 2016/0133728 A1* | 5/2016 | Jang | H01L 29/66803 438/283 |

* cited by examiner

US 9,941,388 B2

METHOD AND STRUCTURE FOR PROTECTING GATES DURING EPITAXIAL GROWTH

FIELD OF THE INVENTION

The present invention relates generally to semiconductor fabrication, and more particularly, to methods and structures for protecting gates during epitaxial growth.

BACKGROUND

Complementary metal-oxide semiconductor (CMOS) field-effect transistors (FETs) are used in many integrated circuit applications, such as signal processing, computing, and wireless communications. CMOS chips in manufacturing comprise planar thick-body devices on bulk Si substrates or silicon-on-insulator (SOI) substrates. Fin type field effect transistor (finFET) devices are becoming more popular as critical dimensions continue to reduce. To enhance carrier mobility, stressor regions may be formed adjacent the gate and channel of the transistor. However, the deposition of stressor regions can cause problems that can adversely affect product yield. It is therefore desirable to have improvements in methods and structures to mitigate these problems.

SUMMARY

Embodiments of the present invention provide methods and structures for protecting gates during epitaxial growth. An inner spacer of a first material is deposited adjacent a transistor gate. An outer spacer of a different material is deposited adjacent the inner spacer. Stressor cavities are formed adjacent the transistor gate. The inner spacer is recessed, forming a divot. The divot is filled with a material to protect the transistor gate. The stressor cavities are then filled. As the gate is safely protected, unwanted epitaxial growth ("mouse ears") on the transistor gate is prevented.

In a first aspect, embodiments of the present invention provide a method of forming a semiconductor structure, comprising: forming a first gate and a second gate on a semiconductor structure; forming a hardmask layer on the first gate and the second gate; forming inner spacers adjacent the first gate and the second gate; forming outer spacers adjacent the inner spacers; masking the first gate; forming stressor cavities adjacent the second gate; recessing a portion of the inner spacers of the second gate to form divots; filling the divots with a dielectric material; and filling the stressor cavities with a stressor material.

In a second aspect, embodiments of the present invention provide a semiconductor structure, comprising: a semiconductor substrate; a transistor gate disposed on the semiconductor substrate; a lower inner spacer disposed adjacent a lower portion of the transistor gate; an upper inner spacer disposed adjacent an upper portion of the transistor gate and in contact with the lower inner spacer; and an outer spacer disposed adjacent to the lower inner spacer and the upper inner spacer.

In a third aspect, embodiments of the present invention provide a semiconductor structure, comprising: a semiconductor substrate; a first transistor gate and a second transistor gate disposed on the semiconductor substrate; a full inner spacer disposed adjacent the first transistor gate; an outer spacer disposed adjacent the full inner spacer; a lower inner spacer disposed adjacent a lower portion of the second transistor gate; an upper inner spacer disposed adjacent an upper portion of the second transistor gate and in contact with the lower inner spacer; and an outer spacer disposed adjacent the lower inner spacer and upper inner spacer of the second transistor gate.

BRIEF DESCRIPTION OF THE DRAWINGS

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Figure 1:
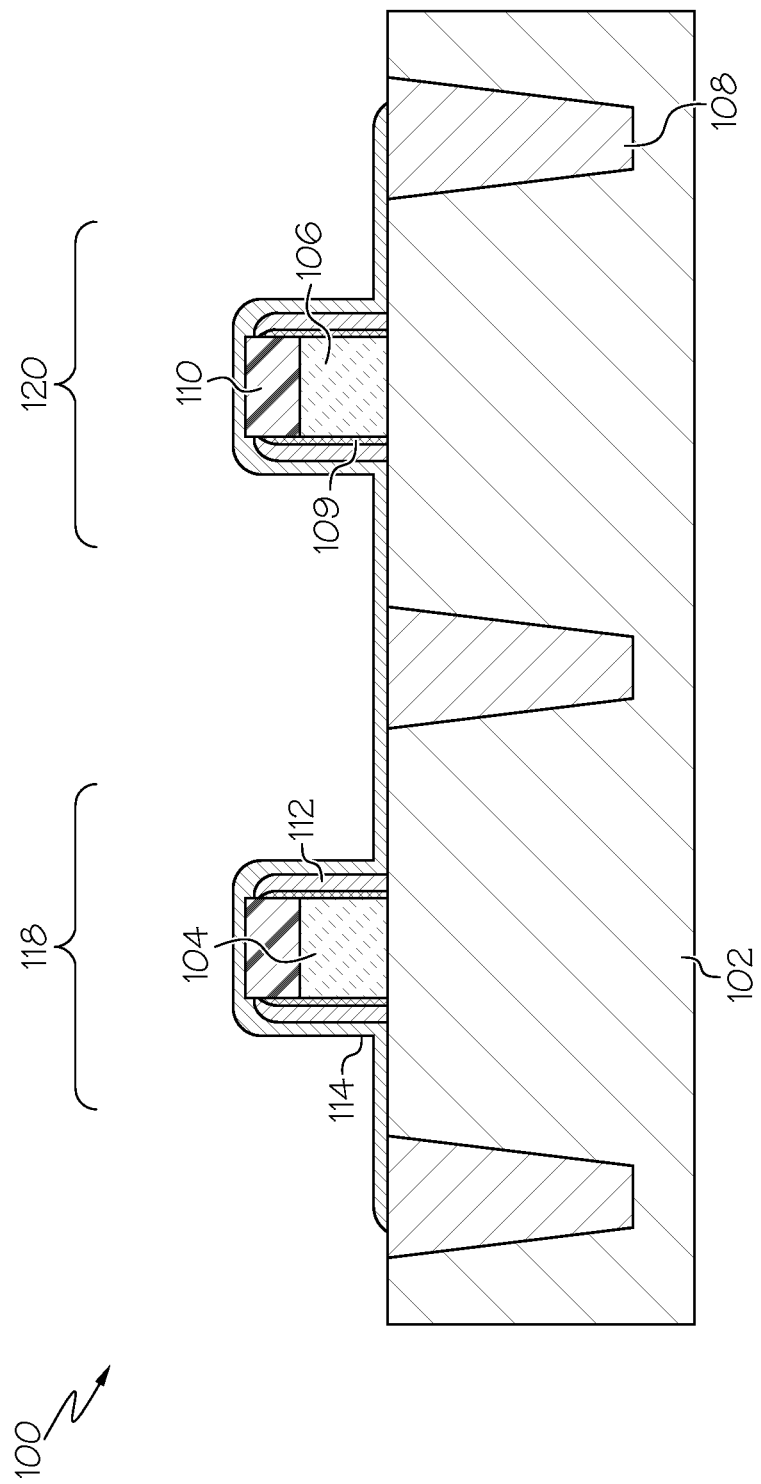
FIG. 1 shows a semiconductor structure at a starting point for embodiments of the present invention.

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, are interchangeable and specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment. It will be understood that one skilled in the art may cross embodiments by "mixing and matching" one or more features of one embodiment with one or more features of another embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, unless otherwise noted, "depositing" or "filling" may include any now known or later developed techniques appropriate for the material to be deposited including, but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 shows a semiconductor structure at a starting point for embodiments of the present invention. The semiconductor structure 100 is a complementary metal oxide semiconductor (CMOS), comprising an N-type field effect transistor (NFET) 118 and a P-type field effect transistor (PFET) 120. It should be recognized that embodiments of the present invention may include planar devices in addition to fin type field effect transistors (finFETs).

The semiconductor structure 100 comprises a substrate 102. The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, silicon germanium (SiGe), or a silicon-on-insulator (SOI) wafer) or one or more die on a wafer, and any epitaxial layers or other type semiconductor layers formed thereover or associated therewith. The semiconductor substrate may be doped, undoped, or contain doped regions and undoped regions therein. The semiconductor substrate may contain regions with strain and regions without strain therein, or contain regions of tensile strain and compressive strain.

A first gate 104 and a second gate 106 are each formed on the substrate 102 of the semiconductor structure 100. In embodiments, the gates may be polysilicon gates. "Transistor gate" and "gate" shall have the same meaning, and are used interchangeably herein. In some embodiments, the gates may be metal gates formed by a replacement metal gate (RMG) process. Shallow trench isolation (STI) regions 108 may be formed in the substrate 102. In embodiments, the STIs 108 may be silicon oxide or other suitable material. A liner 109 may be formed on the sides of the gates 104 and 106. In embodiments, the liner 109 may be comprised of silicon nitride Inner spacers 112 are formed adjacent the first gate 104 and the second gate 106. In some embodiments, inner spacers 112 are silicon oxide, or other suitable material. Outer spacers 114 are formed adjacent the inner spacers 112. In some embodiments, outer spacers 114 may be silicon nitride, or other suitable material. A pad nitride layer 110 is disposed on the gates 104 and 106.

Figure 2:
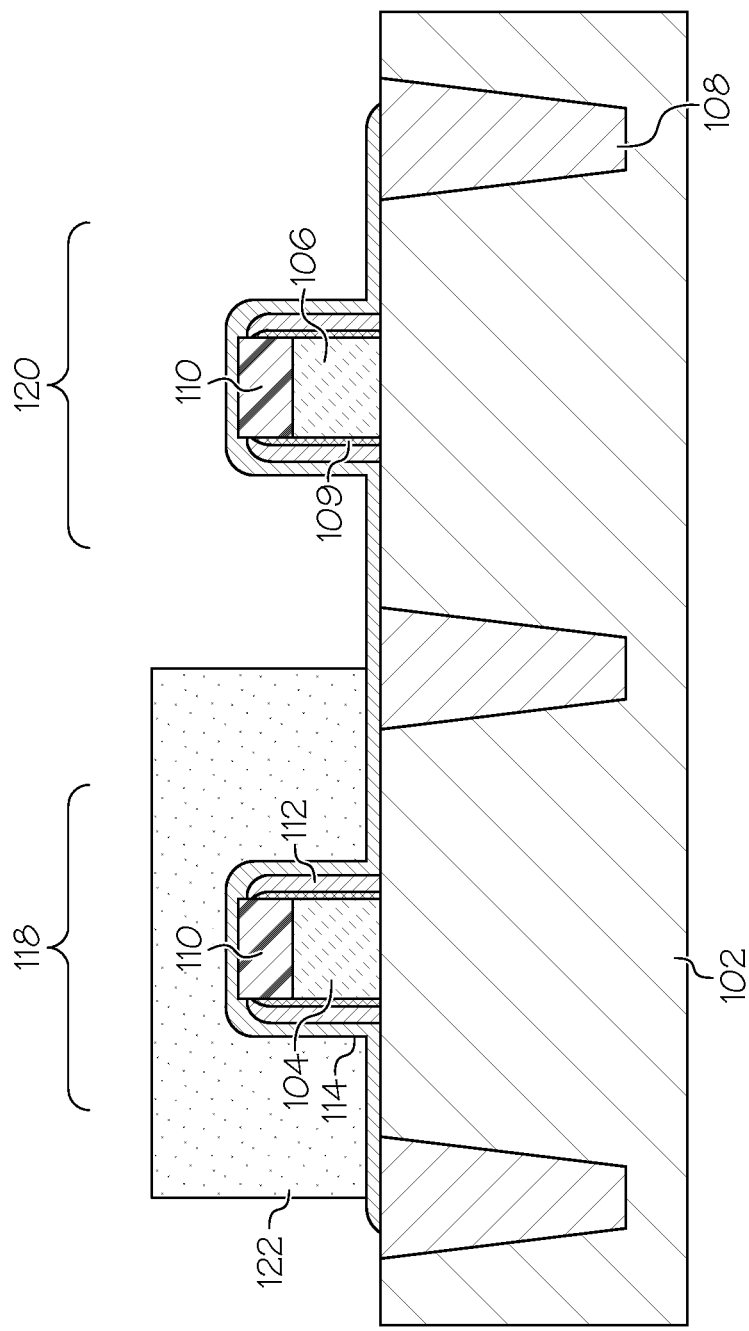
FIG. 2 shows a semiconductor structure after a subsequent process step of masking a transistor.

FIG. 2 shows a semiconductor structure after a subsequent process step of masking a transistor. A mask 122 is deposited over the NFET transistor 118. In embodiments, mask 122 may be SiO2, or other suitable material. Mask 122 may be formed by standard lithographic/patterning techniques. In other embodiments, mask 122 could be deposited over PFET transistor 120, and the process proceeds with respect to the first gate 104 instead of the second gate 106 as described herein. The mask 122 is later removed once processing on the non-masked transistor is completed.

Figure 3:
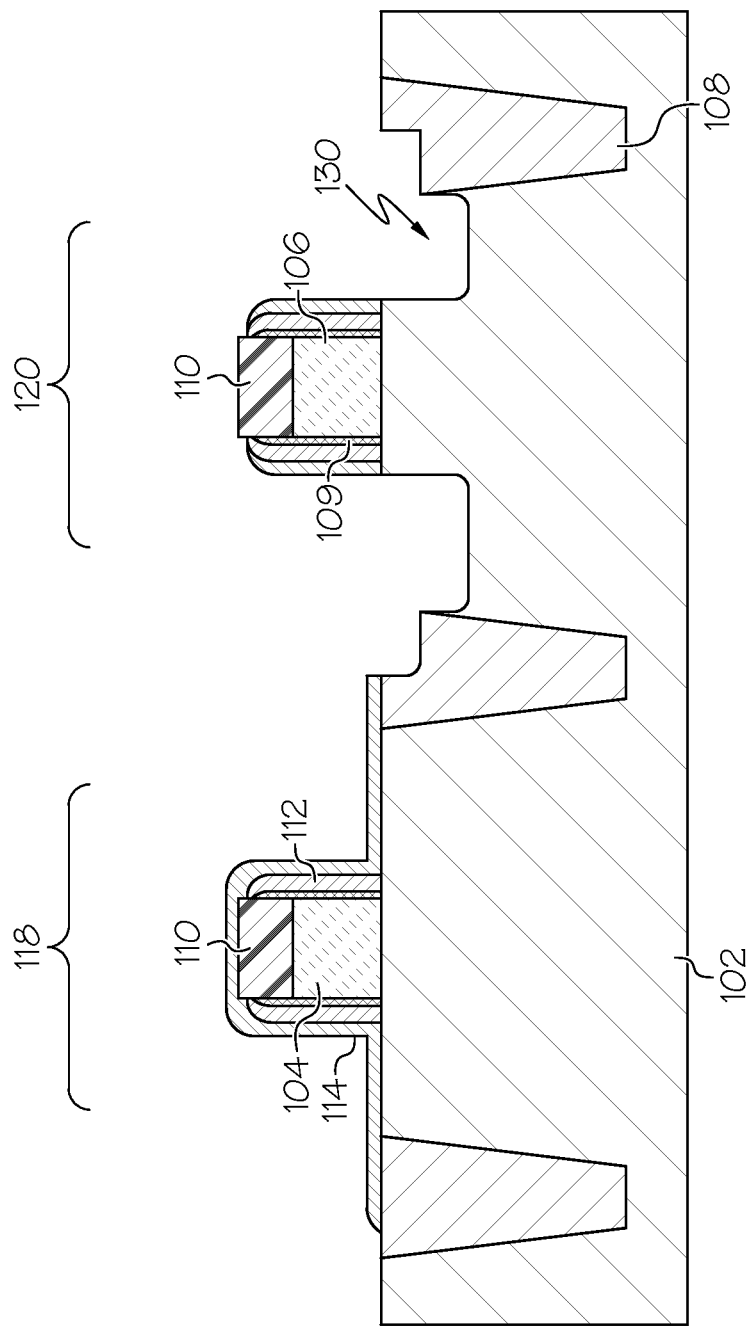
FIG. 3 shows a semiconductor structure after a subsequent process step of forming stressor cavities.

FIG. 3 shows a semiconductor structure after a subsequent process step of forming stressor cavities. Stressor cavities 130 are formed in the substrate 102 adjacent the second gate 106. In embodiments, stressor cavities 130 may be formed by reactive ion etch (RIE), wet etch techniques, or a combination thereof.

Figure 4:
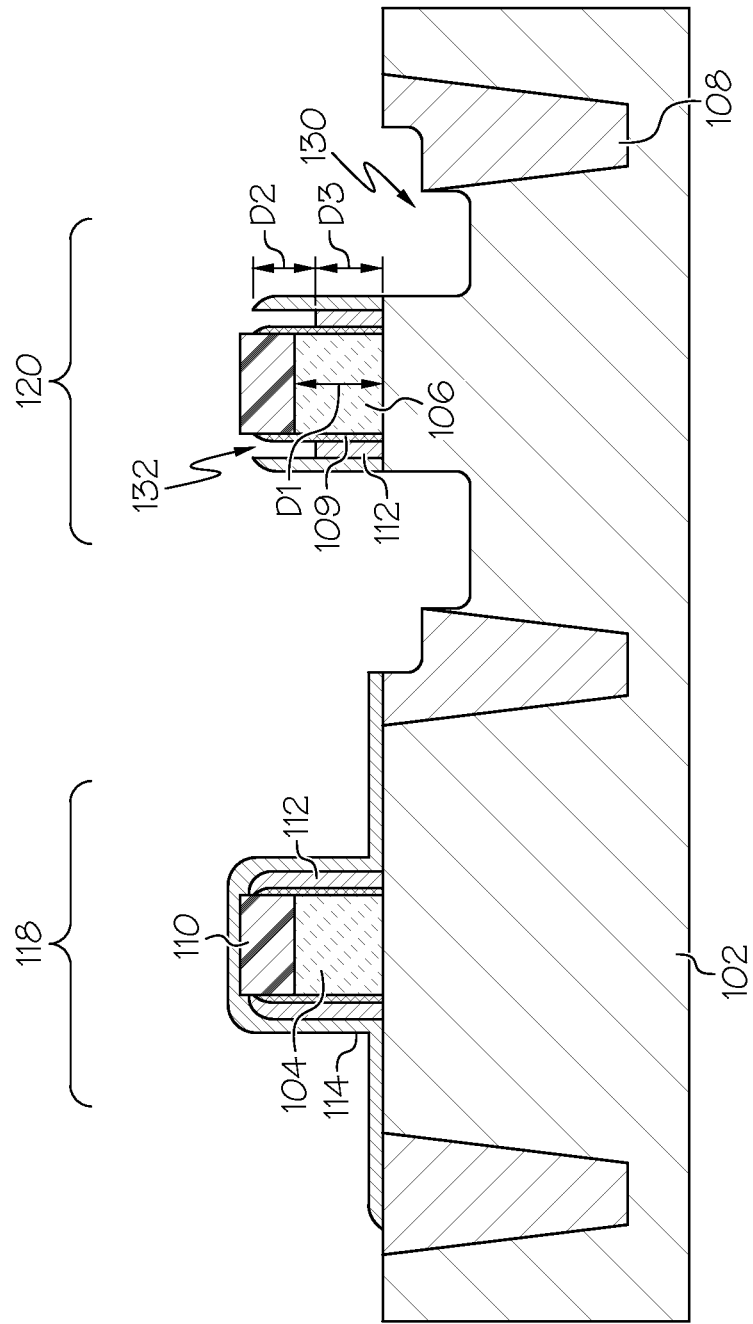
FIG. 4 shows a semiconductor structure after a subsequent process step of forming divots.

FIG. 4 shows a semiconductor structure after a subsequent process step of forming divots. A portion of the inner spacers 112 of the second gate 106 is recessed to form divots 132. The outer spacers 114 remain intact during this process. Any of a number of processes may be used to form the divots 132, including, but not limited to, reactive ion etch (RIE), wet etch, chemical oxide removal (COR) process, or Siconi™ etch process. The recess technique is typically selective such that only the material of the inner spacer 112 is recessed. In embodiments, D1 may range from about 100 nanometers to about 200 nanometers. D2 may range from about 5 to 50 percent of D1, and the sum of D2 and D3 equals D1.

Figure 5:
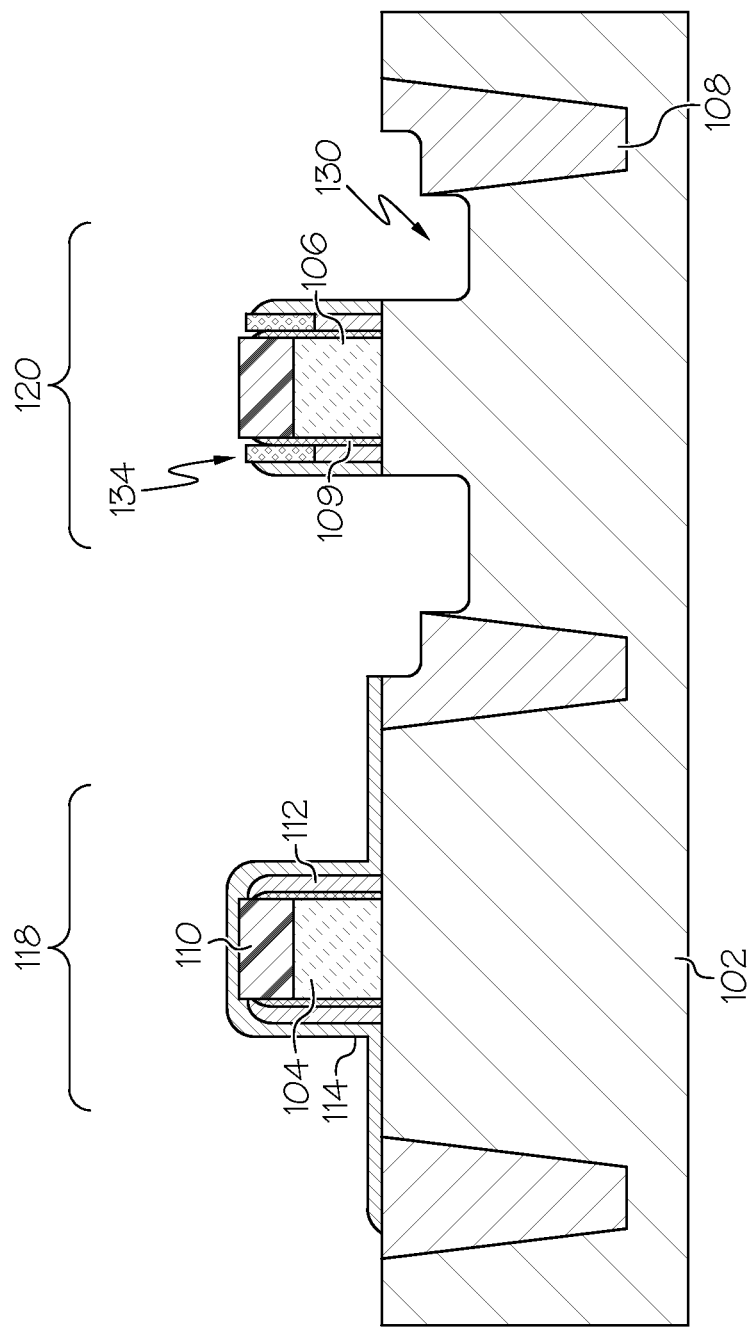
FIG. 5 shows a semiconductor structure after a subsequent process step of filling the divots.

FIG. 5 shows a semiconductor structure after a subsequent process step of filling the divots. The divots 132 are filled with a dielectric material to form an upper spacer 134. The divots 132 are filled with an epitaxial growth inhibiting material to form an upper spacer 134. The epitaxial growth inhibiting material may include a dielectric, for example, but not limited to silicon nitride, silicon carbon nitride, and/or silicon oxycarbide. In embodiments, atomic layer deposition (ALD) may be used to fill divots 132 with the epitaxial growth inhibiting material, such as silicon nitride (or, in some embodiments, SiCN or SiOC). After the divots 132 are filled, a recess (etch back) is performed to make the upper spacer 134 substantially of similar height to outer spacers 114, and expose the silicon substrate 102 of the PFET transistor 120 for stressor region growth.

Figure 6:
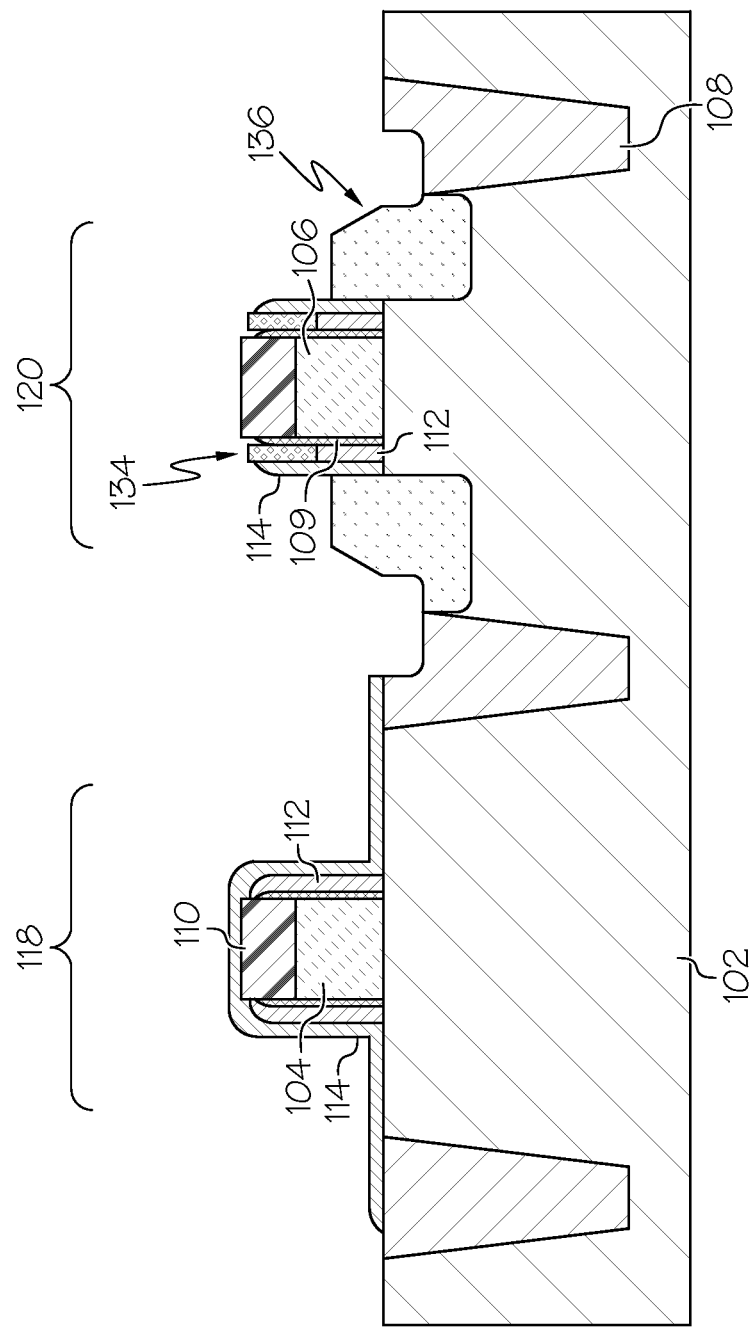
FIG. 6 shows a semiconductor structure after a subsequent process step of filling the stressor cavities.

FIG. 6 shows a semiconductor structure after a subsequent process step of filling the stressor cavities. The stressor cavities 130 are filled with a stressor material 136. In embodiments, stressor material 136 may be epitaxially-grown silicon germanium (eSiGe), or other suitable material. The second gate 106 is now safely protected during formation of stressor region (i.e., 136), thus preventing unwanted growth of the stressor region 136. This unwanted growth is also known as "mouse ear". This occurs when a portion of a gate is exposed during formation of an epitaxial stressor region. Embodiments of the present invention prevent such exposure of the gate, thereby preventing the unwanted growth (mouse ear).

As shown in FIG. 6, an embodiment of the invention comprises a semiconductor substrate 102, having a transistor gate 106. A portion of inner spacer 112 remains, comprising a (lower) inner spacer 112, disposed adjacent a lower portion of the transistor gate 106. Filled divot is an upper inner spacer 134 that is disposed adjacent to an upper portion of the transistor gate 106 and in contact with the lower inner spacer 112. An outer spacer 114 is disposed adjacent the upper inner spacer 134 and the lower inner spacer 112.

In addition, an embodiment of the invention may comprise another transistor gate 104 disposed on the semiconductor substrate 102. A full inner spacer 112 is disposed adjacent the transistor gate 104. An outer spacer 114 is disposed adjacent the full inner spacer.

In embodiments, the lower inner spacer comprises silicon oxide. In embodiments, the upper inner spacer may be silicon nitride, silicon carbon nitride, silicon oxycarbide, and/or another suitable material. In embodiments, the outer spacer may be silicon nitride or other suitable material.

Figure 7:
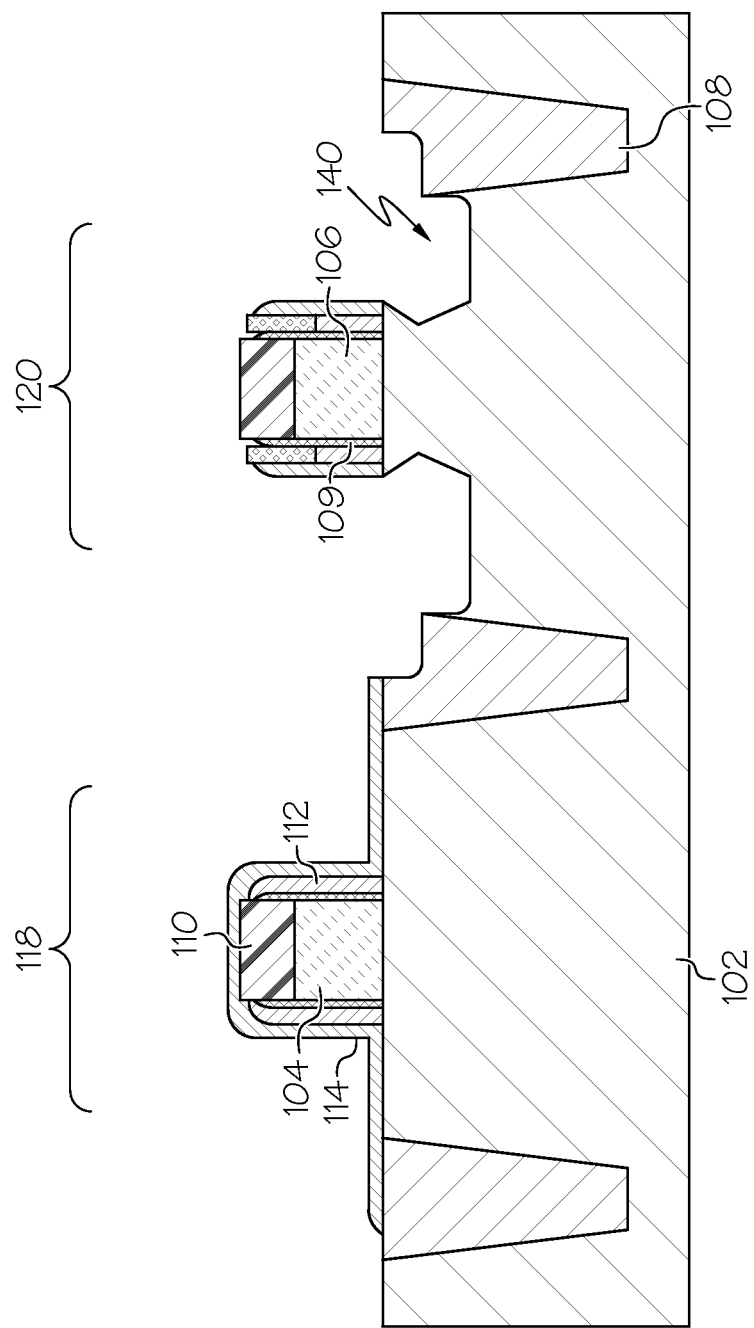
FIG. 7 shows a semiconductor structure after a subsequent process step of forming sigma stressor cavities in accordance with an alternative embodiment.

FIG. 7 shows a semiconductor structure after a subsequent process step of forming sigma stressor cavities in accordance with an alternative embodiment. In an alternative embodiment, the stressor cavities are sigma cavities 140. The sigma cavities 140 may be formed in the substrate 102 under the second gate 106 of the PFET transistor 120. The sigma cavities 140 may be formed by a wet etch, RIE, or combination thereof.

Figure 8:
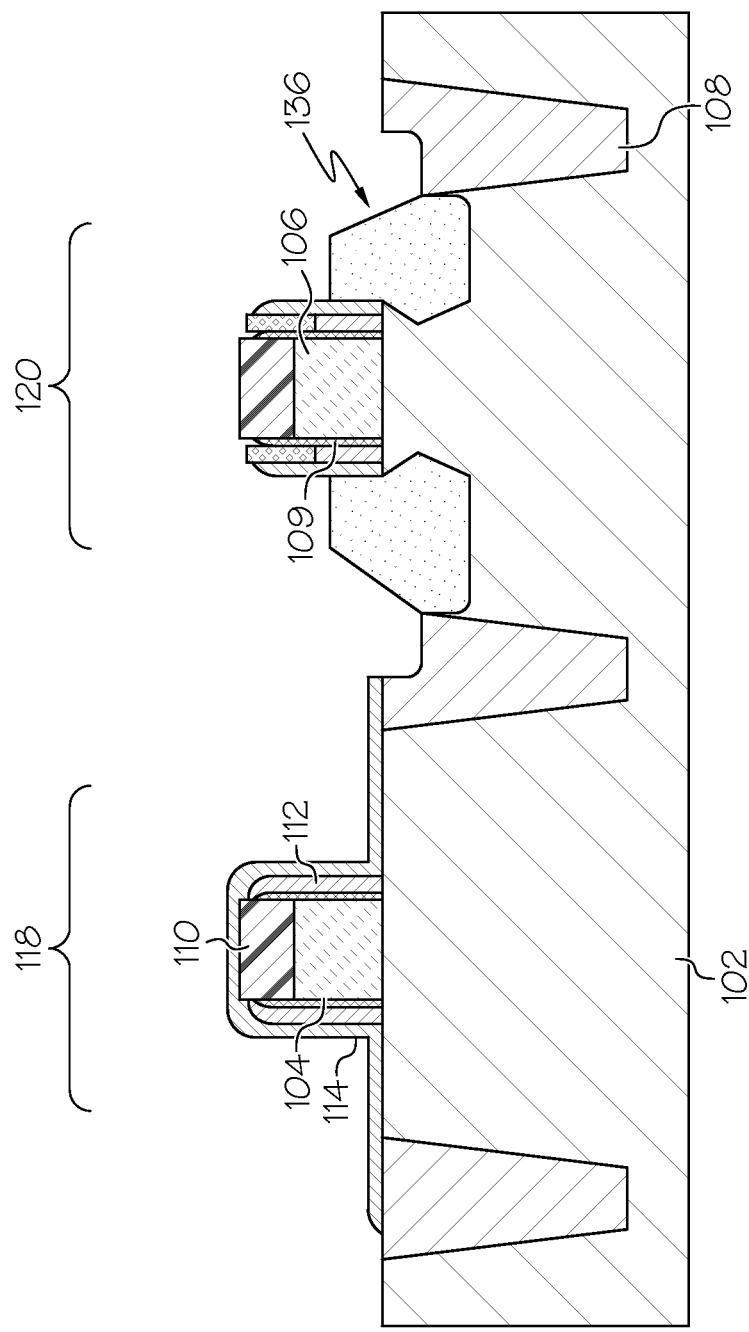
FIG. 8 shows a semiconductor structure after a subsequent process step of filling sigma stressor cavities in accordance with an alternative embodiment.

FIG. 8 shows a semiconductor structure after a subsequent process step of filling sigma stressor cavities in accordance with the alternative embodiment. The stressor material 136 (e.g., eSiGe) is deposited into the stressor cavities 140. The gate 106 is now safely protected during formation of stressor region 136.

Figure 9:
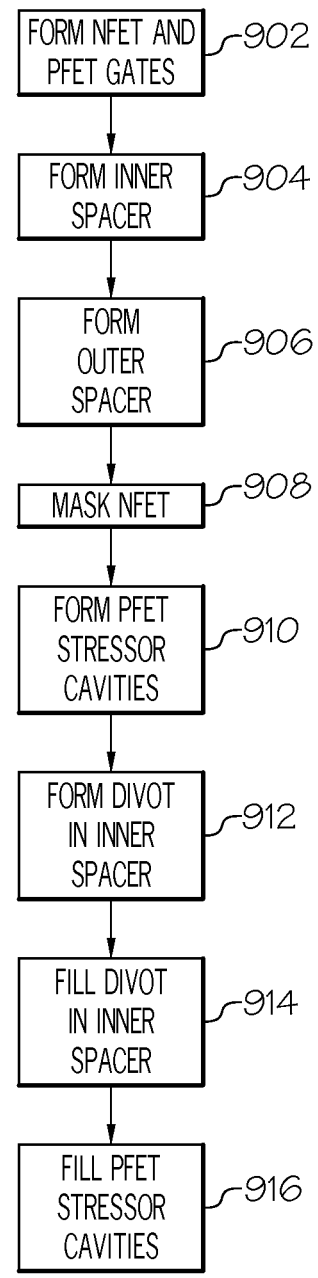
FIG. 9 is a flowchart indicating process steps for embodiments of the present invention.

FIG. 9 is a flowchart indicating process steps for embodiments of the present invention. At 902, a first gate and a second gate are formed on a semiconductor structure. At 904, a hardmask layer is formed on the first gate and the second gate. At 906, inner spacers are formed adjacent the first gate and the second gate. At 906, outer spacers are formed adjacent the inner spacers. At 908, the first gate is masked. At 910, stressor cavities are formed adjacent the second gate. In some embodiments, the cavities can be sigma cavities as illustrated at FIG. 7. At 912, a portion of the inner spacers of the second gate are recessed to form divots. At 914, the divots are filled with an epitaxial growth inhibiting material to form an upper spacer. At 916, stressor cavities are filled with a stressor material.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
    forming a gate on a semiconductor structure;
    forming a hardmask layer on the gate;
    forming inner spacers adjacent to the gate;
    forming outer spacers adjacent to the inner spacers;
    forming stressor cavities adjacent to the gate after forming the outer spacers;
    recessing a portion of the inner spacers of the gate to form divots extending below a top surface of the gate;
    filling the divots with an epitaxial growth inhibiting material selected from silicon carbon nitride or silicon oxycarbide, wherein the epitaxial growth material extends from below the top surface of the gate to above the top surface of the gate, thereby inhibiting epitaxial growth on the gate;
    performing an etch back of the epitaxial growth inhibiting material to form an upper spacer having a height substantially similar to a height of the outer spacers and to expose the substrate; and
    filling the stressor cavities with a stressor material after performing the etch back.

2. The method of claim 1, wherein recessing a portion of the inner spacers performed with a chemical oxide removal process.

3. The method of claim 1, wherein recessing a portion of the inner spacers further comprises performing a selective etch process.

4. The method of claim 1, wherein filling the divots is performed via an atomic layer deposition process.

5. The method of claim 1, wherein recessing the portion of the inner spacers of the gate to form divots extending below the top surface of the gate further comprises recessing the portion of the inner spacers of the gate for forming divots extending below the top surface of the gate by an amount in the range of about 5% to about 50% of the height of the gate.

6. The method of claim 1, wherein forming the inner spacers comprises depositing silicon oxide.

7. The method of claim 1, wherein forming the outer spacers comprises depositing silicon nitride.

8. The method of claim 1, wherein filling the stressor cavities with the stressor material, comprises filling the stressor cavities with silicon germanium.

9. The method of claim 1, wherein forming stressor cavities comprises forming a sigma cavity.

10. A method, comprising:
    forming a transistor gate on a semiconductor substrate;
    forming a lower inner spacer disposed adjacent to a lower portion of the transistor gate below a top surface of the gate;
    forming an upper inner spacer disposed adjacent to an upper portion of the transistor gate and in contact with the lower inner spacer, the upper inner spacer extending from below the top surface of the gate to above the top surface of the gate, the upper inner spacer being formed from an epitaxial growth inhibiting material selected from silicon carbon nitride or silicon oxycarbide to inhibit epitaxial growth on the gate; and
    forming an outer spacer disposed adjacent the lower inner spacer and the upper inner spacer;
    forming a stressor cavity adjacent to the gate after forming the outer spacer;

etching back the epitaxial growth inhibiting material to bring an upper surface of the upper inner spacer to a height substantially similar to a height of the outer spacers; and filling the stressor cavity with a stressor material after etching back.

11. The method of claim 10, wherein forming an upper inner spacer further comprises forming the upper inner spacer extending below the top surface of the gate by an amount in the range of about 5% to about 50% of the height of the gate.

12. The method of claim 10, wherein forming the inner spacers further comprises depositing silicon oxide.

13. The method of claim 10, wherein forming the outer spacer further comprises depositing silicon nitride.

14. The method of claim 10, wherein filling the stressor cavities with the stressor material, further comprises filling the stressor cavities with silicon germanium.

* * * * *